United States Patent
Bostrom et al.

[19]

[11] Patent Number: 5,856,632

[45] Date of Patent: Jan. 5, 1999

[54] CARD CAGE SHIELDING CONTACTOR

[75] Inventors: James H. Bostrom, Robbinsville, N.J.; Leonard G. Meier, Norco, Calif.; Mark Andrews, Wharton, N.J.

[73] Assignee: A K Stamping Co. Inc., Mountainside, N.J.

[21] Appl. No.: 753,993

[22] Filed: Dec. 3, 1996

[51] Int. Cl.$^6$ .................................................. H05K 9/00
[52] U.S. Cl. ................................. 174/35 GC; 361/686; 361/800
[58] Field of Search .......................... 174/35 R, 35 GC; 361/683, 686, 752, 753, 796, 799, 800, 816, 818; 439/61, 88, 92, 95, 609, 947

[56] References Cited

U.S. PATENT DOCUMENTS

| | | | |
|---|---|---|---|
| 4,873,395 | 10/1989 | Mast | 174/35 GC |
| 5,023,754 | 6/1991 | Aug et al. | 361/415 |
| 5,168,428 | 12/1992 | Suzuki | 361/395 |
| 5,317,105 | 5/1994 | Weber | 174/35 GC |
| 5,579,210 | 11/1996 | Ruhland et al. | 361/816 |
| 5,650,922 | 7/1997 | Ho | 361/799 |
| 5,679,923 | 10/1997 | Le | 174/35 R |

*Primary Examiner*—Bot Ledynh
*Assistant Examiner*—Hung V Ngo
*Attorney, Agent, or Firm*—Arthur Jacob

[57] ABSTRACT

A card cage shielding contactor for being interposed between a circuit card bracket and a computer chassis to enhance an electrical shielding connection between the circuit card bracket and the computer chassis when the card cage bracket is juxtaposed with the computer chassis, the card cage shielding contactor including a relatively thin, flexible sheet of electrically conductive material having a multiplicity of contactors in the form of resiliently deflectable fingers located along bands in the sheet and projecting from the bands to establish contact forces enhancing electrical shielding contact between the circuit card bracket and the computer chassis through the card cage shielding contactor.

6 Claims, 4 Drawing Sheets

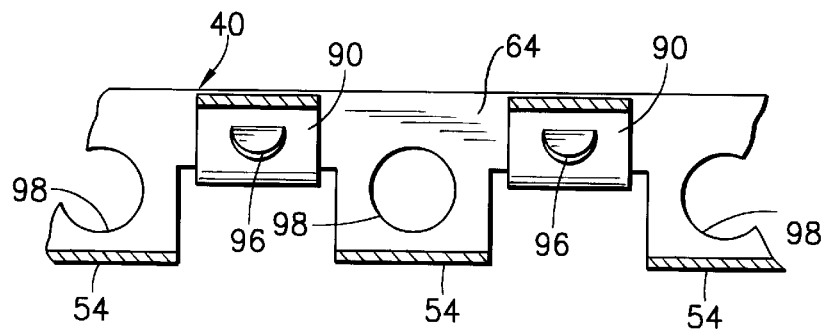
FIG.6
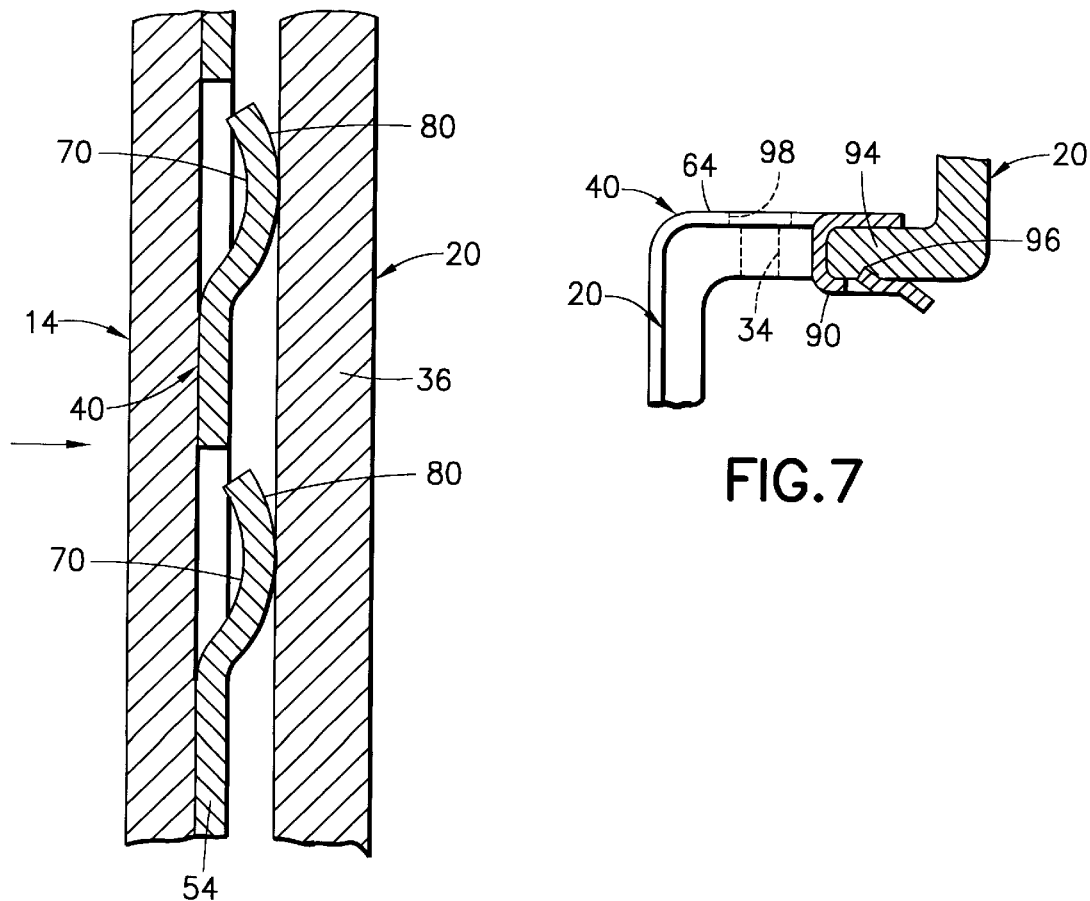
FIG.7
FIG.8

CARD CAGE SHIELDING CONTACTOR

The present invention relates generally to the mounting of circuit cards in computers and pertains, more specifically, to the mounting of circuit card brackets within openings provided in a card cage portion of a computer chassis so as to ensure intimate contact between the circuit card bracket and the computer chassis for enhancing an electrical shielding connection to attenuate unwanted electromagnetic and radio frequency emissions.

Smaller computers, generally known as personal computers, have gone into widespread use, at home as well as in industrial and commercial applications, and now are manufactured in large numbers. As a part of their basic design and construction, these computers provide for the convenient installation of supplemental circuit cards which are mounted in the computer in order to provide a variety of optional functions. The circuit cards each are supplied to customers in the form of a standard mounting bracket already fastened to an edge of a circuit board, and the computer chassis includes a card cage portion having openings for the reception of the circuit cards so that installation merely requires placement of the circuit card within the computer and the securement of the mounting bracket to the computer chassis. However, the openings provided in the card cage portion of the computer chassis increase the susceptibility to unwanted electromagnetic and radio frequency emissions and various arrangements have been suggested for shielding against such emissions.

The present invention provides a card cage shielding contactor which is interposed between the circuit card bracket and the computer chassis for enhancing an electrical shielding connection between the circuit card bracket and the computer chassis to attenuate unwanted electromagnetic and radio frequency emissions. As such, the present invention attains several objects and advantages, some of which are summarized as follows: Provides intimate electrical shielding contact between a circuit card bracket and a computer chassis for enhanced shielding; enables essentially gap-free shielding contact between a circuit card bracket and a computer chassis along every opening in the computer chassis, over essentially the entire length of the bracket, for better shielding; provides a simple and effective card cage shielding contactor readily incorporated into existing computer chassis arrangements for accepting standard circuit card brackets in a conventional manner while attaining enhanced shielding; enables the ready insertion of additional circuit card brackets into a computer chassis with ease and without the necessity for special tools or procedures to attain the desired shielding; provides a simplified, economical construction readily incorporated into a computer chassis for long-term reliable service.

The above objects and advantages, as well as further objects and advantages, are attained by the present invention which may be described briefly as a card cage shielding contactor for being interposed between a circuit card bracket and a computer chassis to enhance an electrical shielding connection between the circuit card bracket and the computer chassis when the card cage bracket is juxtaposed with the computer chassis, the computer chassis having at least one longitudinally extending opening bounded by laterally spaced apart chassis column portions of the computer chassis, the circuit card bracket overlapping the chassis column portions when the circuit card bracket is juxtaposed altitudinally with the computer chassis, the card cage shielding contactor comprising: a relatively thin, flexible sheet of electrically conductive material having a first end, a longitudinally opposite second end, and laterally opposite sides; at least one longitudinally extending aperture in the sheet for registration with a corresponding opening in the computer chassis; laterally opposite bands extending longitudinally alongside the aperture between the first and second ends of the sheet for juxtaposition with corresponding chassis column portions, each of the bands having laterally opposite edges, an obverse face and a reverse face; and a multiplicity of contactors located along the bands, each contactor being spaced laterally from both of the opposite edges, spaced longitudinally from the first and second ends, and projecting altitudinally from the bands to establish contact forces enhancing electrical shielding contact between the circuit card bracket and the computer chassis through the card cage shielding contactor.

The invention will be understood more fully, while still further objects and advantages will become apparent, in the following detailed description of a preferred embodiment of the invention illustrated in the accompanying drawing, in which:

FIG. 6 is a bottom plan view of the fragment of FIG. 5;

FIG. 7 is a fragmentary cross-sectional view of another portion of the card cage shielding contactor showing the attachment of the card cage shielding contactor to the computer chassis; and FIG. 8 is a fragmentary cross-sectional view showing the interposition of the card cage shielding contactor between the circuit card bracket and the computer chassis.

Figure 1:
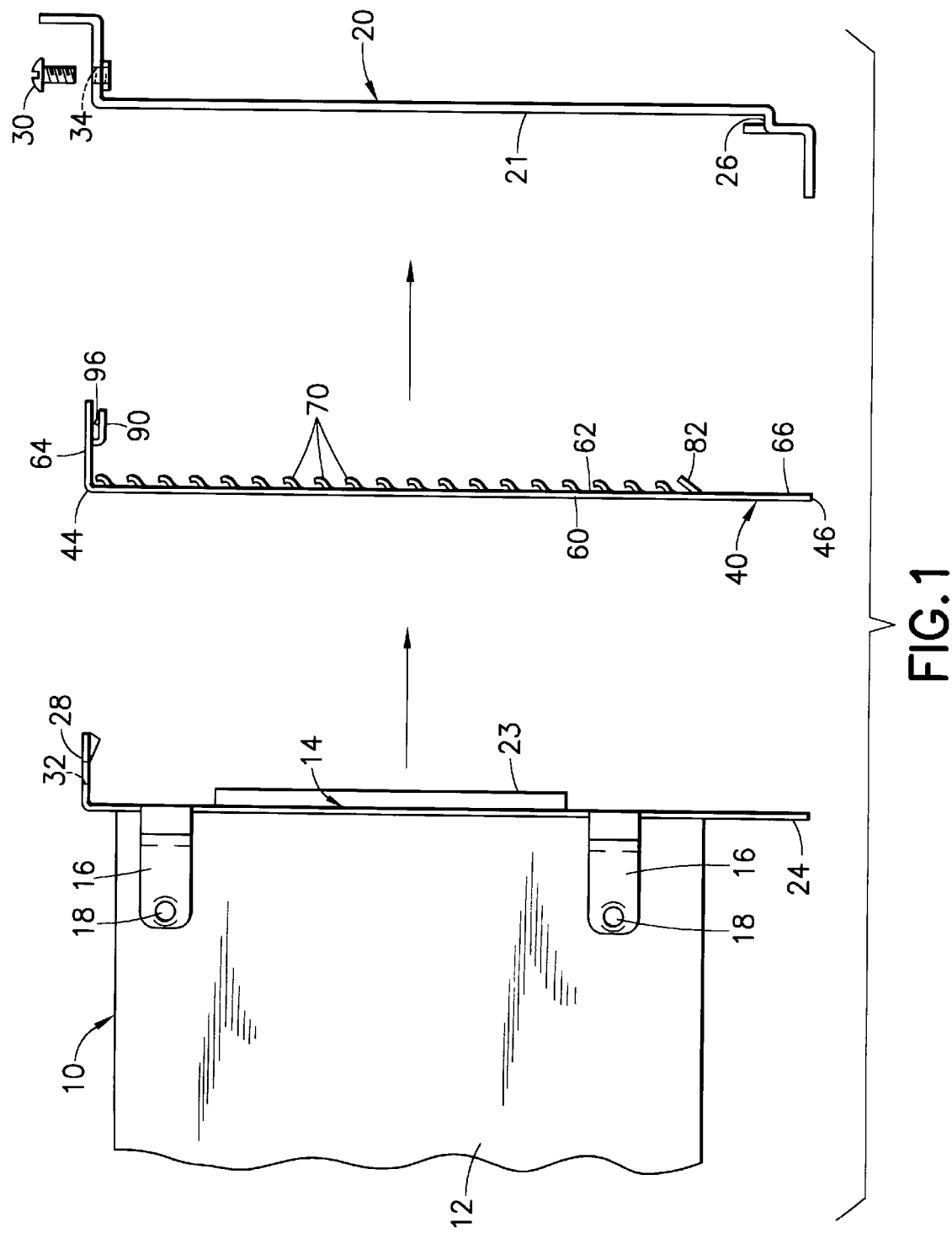
FIG. 1 is an exploded side elevational view showing a card cage shielding contactor of the present invention about to be interposed between a circuit card bracket and a computer chassis.
Figure 2:
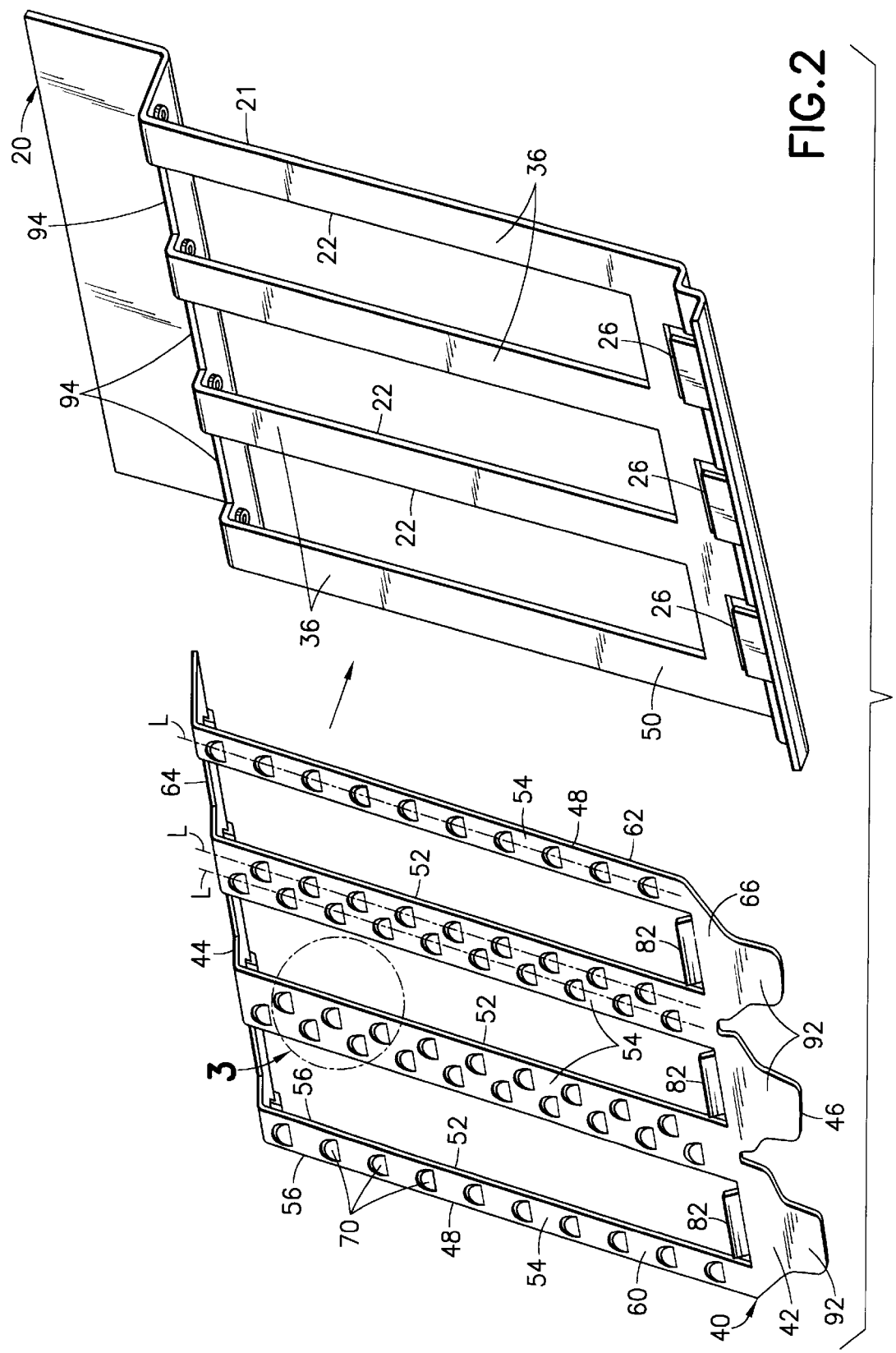
FIG. 2 is an exploded perspective view illustrating the card cage shielding contactor and the computer chassis.

Referring now to the drawing, and especially to FIGS. 1 and 2 thereof, a circuit card 10 is seen to include a circuit board 12 and a circuit card bracket 14 affixed to the circuit board 12 by means of arms 16 which are unitary with the circuit card bracket 14 and are fastened to the circuit board 12 at 18, in a now conventional manner. Circuit card 10 is to be mounted in a computer chassis 20 at a card cage portion 21 of the computer chassis 20, the card cage portion 21 including a plurality of openings 22 provided for the reception of circuit cards like that illustrated by circuit card 10, with each opening 22 enabling access to a connector 23 carried by the circuit board 12. Mounting of the circuit card 10 is to be accomplished by juxtaposing the bracket 14 with the selected opening 22, placing a tongue 24 of the bracket 14 within a slot 26 in the computer chassis 20 and then securing a tab 28 of the bracket 14 to the computer chassis 20 by means of a threaded fastener 30 which is passed through a hole 32 in the tab 28 and into a corresponding threaded hole 34 in the computer chassis 20. The bracket 14 then overlaps and essentially closes the opening 22.

Experience has demonstrated that the openings 22 in the computer chassis 20 increase the susceptibility to unwanted electromagnetic and radio frequency emissions. In order to attenuate such emissions, it becomes necessary to attain intimate electrical contact between each circuit card bracket 14 and the corresponding structure of the computer chassis 20 adjacent the opening 22 over which the bracket 14 is mounted, the corresponding portions of the computer chassis 20 being shown in the form of column portions 36 extending longitudinally alongside each opening 22. It is noted that where there are unused openings 22, the unused openings 22 must be covered with a blank circuit card bracket in order to maintain the shielding integrity of the computer chassis 20 and avoid unwanted electromagnetic and radio frequency emissions. The present invention assures intimate electrical contact between each circuit card bracket 14 and the computer chassis 20, whether the bracket 14 is a part of a circuit card 10 or is a blank. To this end, the present invention provides a card cage shielding contactor 40 to be interposed between each bracket 14 and the computer chassis 20.

Card cage shielding contactor 40 is constructed of a relatively thin, flexible sheet 42 of electrically conductive material, the preferred material being a metal, such as stainless steel having a thickness of about 0.003 inch. Sheet 42 extends longitudinally between a first end 44 and a longitudinally opposite second end 46, and extends laterally between laterally opposite sides 48. The overall longitudinal and lateral dimensions of sheet 42 are made to correspond essentially to the counterpart longitudinal and lateral dimensions of the relevant portion 50 of the computer chassis 20. A plurality of longitudinally extending apertures 52 in the sheet 42 are located and dimensioned so as to correspond with the openings 22 in the computer chassis 20 and to be registered with corresponding openings 22 when the card cage shielding contactor 40 is juxtaposed with the computer chassis 20. Laterally opposite bands 54 extend longitudinally alongside each aperture 52 between the first and second ends 44 and 46 of the sheet 42, the bands 54 each having laterally opposite edges 56, an obverse face 60 and a reverse face 62. A first web 64 extends laterally across the sheet 42 adjacent the first end 44 of the sheet 42 and interconnects the bands 54 adjacent the first end 44 of the sheet 42, and a second web 66 extends laterally across the sheet 42 adjacent the second end 46 of the sheet 42 and interconnects the bands 54 adjacent the second end 46 of the sheet 42 to complete a one-piece, unitary structure.

A multiplicity of contactors, shown in the form of fingers 70, are located along the bands 54, each finger 70 being spaced laterally from both of the opposite edges 56 of the band 54 upon which the finger 70 is located, as well as being spaced longitudinally from the first and second ends 44 and 46 of sheet 42. In the preferred construction, fingers 70 are struck from the sheet 42, to project altitudinally from the bands 54, all in the same altitudinal direction, which is a first altitudinal direction extending from the obverse face 60 toward the reverse face 62, with the fingers 70 being aligned along straight lines L extending longitudinally essentially parallel with the edges 56 of the bands 54, the lines L being arranged such that one line L is associated with each edge 56 and, consequently, with each longitudinal boundary of the apertures 52.

Figure 3:
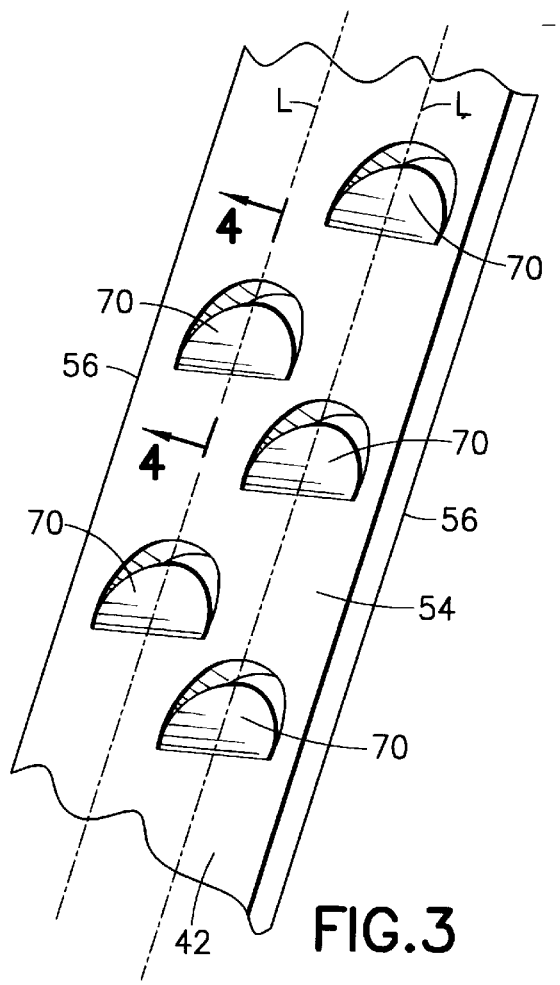
FIG. 3 is an enlarged fragmentary perspective view of a portion of the card cage shielding contactor indicated by the numeral 3 in FIG. 2.
Figure 4:
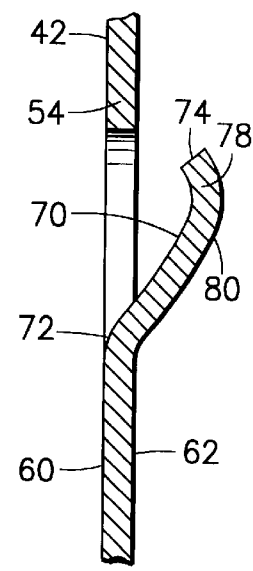
FIG. 4 is a cross-sectional view taken along line 4—4 of FIG. 3.

As best seen in FIGS. 3 and 4, each finger 70 is in the form of a cantilever having a root 72 at the sheet 42 and a free tip 74 remote from the root 72 so as to be spaced from the sheet 42 in the first altitudinal direction. Preferably, tip 74 is provided with a rounded transverse profile configuration, as indicated at 76. Each finger 70 includes a tip portion 78 adjacent corresponding tip 74 and swept back toward the sheet 42 in a second altitudinal direction extending opposite the first altitudinal direction to establish a relatively smooth contactor surface 80 adjacent the tip 74 of each finger 70. The resilient nature of the material of sheet 42 enables resilient deflection of the fingers 70 in the opposite altitudinal directions, as will be described more fully below.

Figure 5:
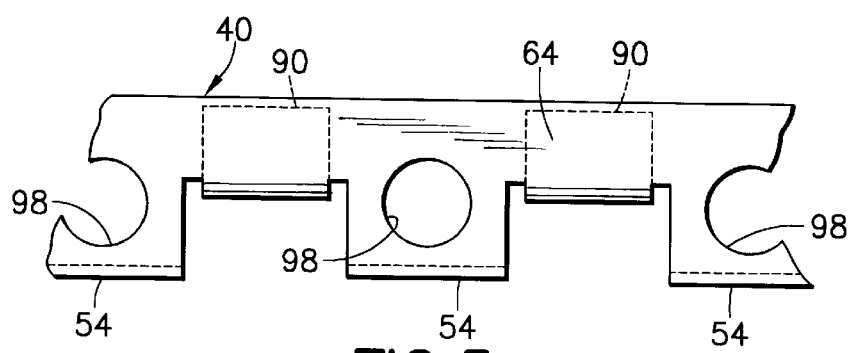
FIG. 5 is an enlarged top plan view of a fragment of the card cage shielding contactor.
Figure 3:
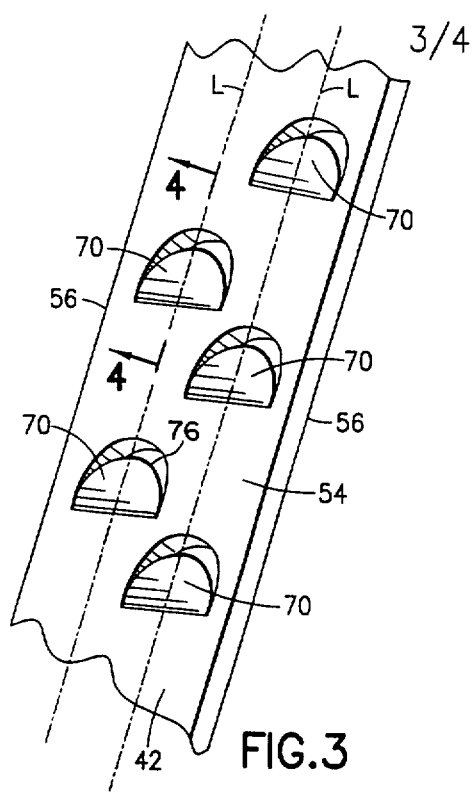
Figure 4:
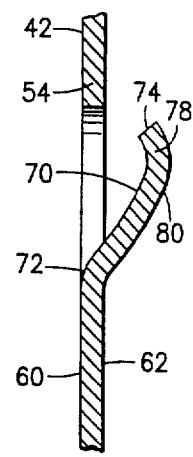
Figure 5:
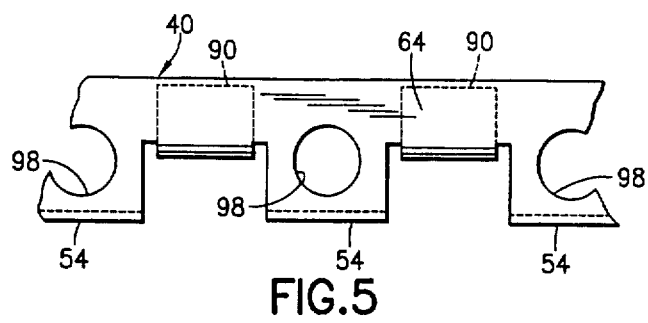

Turning now to FIGS. 5 through 7, as well as to FIGS. 1 and 2, card cage shielding contactor 40 is affixed to computer chassis 20 by means of clips 90 formed integral with the first web 64 and located between adjacent bands 54, and tabs 92 extending longitudinally from the second web 66 and located between adjacent bands 54. Tabs 92 are received within the slots 26 of the computer chassis 20 and clips 90 are engaged with bar portions 94 of the computer chassis 20 to secure the card cage shielding contactor 40 in place on the computer chassis 20, with the reverse face 62 of each band 54 confronting the column portions 36 of the computer chassis 20. The resilient nature of the material of sheet 42 provides each clip 90 with a resilient gripping force which grips each corresponding bar portion 94 with a retaining force sufficient to secure the card cage shielding contactor 40 in place upon the computer chassis 20. A small barb 96 on each clip 90 assists in resisting uncoupling of the clip 90 from the bar portion 94. When the card cage shielding contactor 40 is affixed to the computer chassis 20, as described above, holes 98 in the first web 64 are registered with counterpart threaded holes 34 in the computer chassis 20.

With the card cage shielding contactor 40 in place upon the computer chassis 20, the circuit card bracket 14 is mounted to the computer chassis 20, over the card cage shielding contactor 40 so that the card cage shielding contactor 40 is interposed between the overlapping portions of bracket 14 and computer chassis 20, as seen in FIG. 8. The arrangement which provides a multiplicity of fingers 70 along lines L adjacent the opening 22 over which the bracket 14 is placed enables deflection of those fingers 70 to establish resilient biasing forces which enhance electrical contact over the longitudinal length of the bracket 14 and column portions 36 of the computer chassis 20 for effective shielding and attenuation of electromagnetic and radio frequency radiation. The provision of a multiplicity of relatively small fingers 70 along the longitudinal portions of the perimeter of the opening 22 assures intimate contact along the length of the bracket 14 and concomitant enhanced shielding. In the illustrated embodiment, nineteen fingers 70 are shown located along those bands 54 which are placed between two adjacent apertures 52, the fingers 70 being aligned along two lines L, with each line L adjacent one of the two adjacent apertures 52. The flexible nature of the thin material of sheet 42 provides bands 54 with a high degree of compliance enabling effective electrical shielding contact between the confronting portions of the bracket 14 and the computer chassis 20, through the interposed card cage shielding contactor 40.

It is noted that the projection of all of the fingers 70 in the first altitudinal direction assures that upon affixation of the card cage shielding contactor 40 to the computer chassis 20, all of the fingers 70 will be located between the reverse face 62 of the bands 54 of the card cage shielding contactor 40 and the computer chassis 20, thereby presenting relatively flat obverse faces 60 to a bracket 14 so as to preclude any snagging of a bracket 14 as the bracket 14 is being mounted upon the computer chassis 20. Further, the provision of a smooth contactor surface 80 adjacent the tip 74 of each finger 70 assures that the fingers 70, when deflected, will sweep along the counterpart surface of the computer chassis 20 smoothly, in a generally wiping contact, without digging into the computer chassis 20, thereby precluding any snagging of the fingers 70 on the computer chassis 20 and facilitating the desired intimate contact along the bracket 14 and the computer chassis 20, free of any deleterious gaps. A lead-in flap 82 on the second web 66, along the lower boundary of each aperture 52, facilitates the insertion of the tab 24 of a bracket 14 into the corresponding slot 26 of the computer chassis 20 by avoiding any hang-up of the tab 24 of the bracket 14 on the card cage shielding contactor 40 during mounting of the bracket 14 on the computer chassis 20.

The spacing of the fingers 70 both laterally from the opposite edges 56 of the bands 54 and longitudinally from the first and second ends 44 and 46 of the sheet 42, contributes to the ability of the card cage shielding contactor 40 to attain the desired shielding integrity through continuity in the portions of the sheet 42 surrounding the fingers 70, as well as through enhancement of the resilient contact provided by the card cage shielding contactor 40. Where a band 54 is located between adjacent apertures 52, two lines of fingers 70 are provided, with one line of fingers 70 adjacent each aperture 52 for effecting the desired shielding contact along both apertures 52. Where two such lines of fingers 70 are located on a band 54, the fingers 70 of one of the two lines preferably are staggered longitudinally relative to the fingers 70 of the other of the two lines, as shown, in order to assure that each finger 70 is surrounded by the material of sheet 42 so as to preserve the integrity of the band 54 and the ability of the fingers 70 to accomplish the desired shielding contact while, at the same time, minimizing the spacing between adjacent fingers 70 for more intimate contact.

It will be seen that the present invention attains the several objects and advantages summarized above, namely: Provides intimate electrical shielding contact between a circuit card bracket and a computer chassis for enhanced shielding; enables essentially gap-free shielding contact between a circuit card bracket and a computer chassis along every opening in the computer chassis, over essentially the entire length of the bracket, for better shielding; provides a simple and effective card cage shielding contactor readily incorporated into existing computer chassis arrangements for accepting standard circuit card brackets in a conventional manner while attaining enhanced shielding; enables the ready insertion of additional circuit card brackets into a computer chassis with ease and without the necessity for special tools or procedures to attain the desired shielding; provides a simplified, economical construction readily incorporated into a computer chassis for long-term reliable service.

It is to be understood that the above detailed description of a preferred embodiment of the invention is provided by way of example only. Various details of design and construction may be modified without departing from the true spirit and scope of the invention, as set forth in the appended claims.

The embodiments of the invention in which an exclusive property or privilege is claimed are defined as follows:

1. A card cage shielding contactor for being interposed between a circuit card bracket and a computer chassis to enhance an electrical shielding connection between the circuit card bracket and the computer chassis when the card cage bracket is juxtaposed with the computer chassis, the computer chassis having at least one longitudinally extending opening bounded by laterally spaced apart chassis column portions of the computer chassis, the circuit card bracket overlapping the chassis column portions when the circuit card bracket is juxtaposed altitudinally with the computer chassis, the card cage shielding contactor comprising:

a relatively thin, flexible sheet of electrically conductive material having a first end, a longitudinally opposite second end, and laterally opposite sides;

at least one longitudinally extending aperture in the sheet for registration with a corresponding opening in the computer chassis;

laterally opposite bands extending longitudinally alongside the aperture between the first and second ends of the sheet for juxtaposition with corresponding chassis column portions, each of the bands having laterally opposite edges, an obverse face and a reverse face; and a multiplicity of contactors located along the bands, each of said contactors being spaced laterally from both of the opposite edges, spaced longitudinally from the first and second ends, and projecting altitudinally from the bands to establish contact forces enhancing electrical shielding contact between the circuit card bracket and the computer chassis through the card cage shielding contactor, the contactors comprising fingers struck from the sheet in a first altitudinal direction toward one of the circuit card bracket and the computer chassis, each of said fingers being in the form of a cantilever extending in a longitudinal direction from a root at the sheet to a tip spaced from the sheet in the first altitudinal direction, the tip having a rounded profile configuration transverse to the longitudinal direction such that the contact forces move the tip of the cantilever alone the longitudinal direction to establish the enhanced electrical shielding contact.

2. A card cage shielding contactor for being interposed between a circuit card bracket and a computer chassis to enhance an electrical shielding connection between the circuit card bracket and the computer chassis when the card cage bracket is juxtaposed with the computer chassis, the computer chassis having at least one longitudinally extending opening bounded by laterally spaced apart chassis column portions of the computer chassis, the circuit card bracket overlapping the chassis column portions when the circuit card bracket is juxtaposed altitudinally with the computer chassis, the card cage shielding contactor comprising:

a relatively thin, flexible sheet of electrically conductive material having a first end, a longitudinally opposite second end, and laterally opposite sides;

at least one longitudinally extending aperture in the sheet for registration with a corresponding opening in the computer chassis;

laterally opposite bands extending longitudinally alongside the aperture between the first and second ends of the sheet for juxtaposition with corresponding chassis column portions, each of the bands having laterally opposite edges, an obverse face and a reverse face; and a multiplicity of contactors located along the bands, each of said contactors being spaced laterally from both of the opposite edges, spaced longitudinally from the first and second ends, and projecting altitudinally from the bands to establish contact forces enhancing electrical shielding contact between the circuit card bracket and the computer chassis through the card cage shielding contactor, the contactors comprising fingers struck from the sheet in a first altitudinal direction toward one of the circuit card bracket and the computer chassis, each of said fingers being in the form of a cantilever extending in a longitudinal direction from a root at the sheet to a tip spaced from the sheet in the first altitudinal direction, the fingers each including a tip portion swept back in a second altitudinal direction opposite to the first altitudinal direction for enabling a wiping contact between the finger and the confronting one of the circuit card bracket and the computer chassis, the tip having a rounded profile configuration transverse to the longitudinal direction such that the wiping contact is facilitated for establishing the enhanced electrical shielding contact.

3. The card cage shielding contactor of claim 2 wherein the fingers all project from the band in the same altitudinal direction.

4. The card cage shielding contactor of claim 3 wherein the obverse face of each band confronts the circuit card bracket and the reverse face of said each band confronts the computer chassis, when the card cage shielding contactor is interposed between the circuit card bracket and the computer chassis, and the same altitudinal direction extends from the obverse face toward the reverse face.

5. A card cage shielding contactor for being interposed between a circuit card bracket and a computer chassis to enhance an electrical shielding connection between the circuit card bracket and the computer chassis when the card cage bracket is juxtaposed with the computer chassis, the computer chassis having at least one longitudinally extending opening bounded by laterally spaced apart chassis column portions of the computer chassis, the circuit card bracket overlapping the chassis column portions when the circuit card bracket is juxtaposed altitudinally with the computer chassis, the card cage shielding contactor comprising:

a relatively thin, flexible sheet of electrically conductive material having a first end, a longitudinally opposite second end, and laterally opposite sides;

at least one longitudinally extending aperture in the sheet for registration with a corresponding opening in the computer chassis;

laterally opposite bands extending longitudinally alongside the aperture between the first and second ends of the sheet for juxtaposition with corresponding chassis column portions, each of the bands having laterally opposite edges, an obverse face and a reverse face, a multiplicity of contactors located along the bands, each of said contactors being spaced laterally from both of the opposite edges, spaced longitudinally from the first and second ends, and projecting altitudinally from the bands to establish contact forces enhancing electrical shielding contact between the circuit card bracket and the computer chassis through the card cage shielding contactor, the contactors comprising fingers struck from the sheet in a first altitudinal direction toward one of the circuit card bracket and the computer chassis, each of said fingers being in the form of a cantilever extending in a longitudinal direction from a root at the sheet to a tip spaced from the sheet in the first altitudinal direction, the tip having a rounded profile configuration transverse to the longitudinal direction such that the contact forces move the tip of the cantilever along the longitudinal direction to establish the enhanced electrical shielding contact;

a web extending laterally along the sheet adjacent the first end of the sheet; and at least one retention clip on the web for securing the web to the computer chassis.

6. A card cage shielding contactor for being interposed between a circuit card bracket and a computer chassis to enhance an electrical shielding connection between the circuit card bracket and the computer chassis when the card cage bracket is juxtaposed with the computer chassis, the computer chassis having at least one longitudinally extending opening bounded by laterally spaced apart chassis column portions of the computer chassis, the circuit card bracket overlapping the chassis column portions when the circuit card bracket is juxtaposed altitudinally with the computer chassis, the card cage shielding contactor comprising:

a relatively thin, flexible sheet of electrically conductive material having a first end, a longitudinally opposite second end, and laterally opposite sides;

at least one longitudinally extending aperture in the sheet for registration with a corresponding opening in the computer chassis;

laterally opposite bands extending longitudinally alongside the aperture between the first and second ends of the sheet for juxtaposition with corresponding chassis column portions, each of the bands having laterally opposite edges, an obverse face and a reverse face; and a multiplicity of contactors located along the bands, each of said contactors being spaced laterally from both of the opposite edges, spaced longitudinally from the first and second ends, and projecting altitudinally from the bands to establish contact forces enhancing electrical shielding contact between the circuit card bracket and the computer chassis through the card cage shielding contactor;

a first web extending laterally along the sheet adjacent the first end of the sheet;

at least one retention clip on the first web for securing the first web to the computer chassis;

a second web extending laterally along the sheet adjacent the second end of the sheet; and at least one tab on the second web for securing the second web to the computer chassis.

* * * * *

UNITED STATES PATENT AND TRADEMARK OFFICE
CERTIFICATE OF CORRECTION

PATENT NO : 5,856,632                              Page 1 of 2
DATED : January 5, 1999
INVENTOR(S): James H. Bostrom et al It is certified that error appears in the above-identified patent and that said Letters Patent are hereby corrected as shown below:

Delete drawing sheet 3, and substitute therefor the drawing sheet, consisting of Figs. 3-5, as shown on the attached page.

Column 6, line 28, "alone" should read --along--.

Signed and Sealed this

Twenty-second Day of May, 2001

Attest:

NICHOLAS P. GODICI

Attesting Officer                Acting Director of the United States Patent and Trademark Office